(12) United States Patent
Xie et al.

(10) Patent No.: US 12,245,517 B2
(45) Date of Patent: Mar. 4, 2025

(54) MRAM STACK WITH REDUCED HEIGHT

(71) Applicant: INTERNATIONAL BUSINESS MACHINES CORPORATION, Armonk, NY (US)

(72) Inventors: Ruilong Xie, Niskayuna, NY (US); Dimitri Houssameddine, Sunnyvale, CA (US); Kangguo Cheng, Schenectady, NY (US); Julien Frougier, Albany, NY (US); Bruce B. Doris, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 547 days.

(21) Appl. No.: 17/464,076

(22) Filed: Sep. 1, 2021

(65) Prior Publication Data
US 2023/0060906 A1    Mar. 2, 2023

(51) Int. Cl.
H10B 61/00 (2023.01)
H10N 50/01 (2023.01)
H10N 50/10 (2023.01)
H10N 50/80 (2023.01)

(52) U.S. Cl.
CPC .......... H10N 50/80 (2023.02); H10B 61/00 (2023.02); H10N 50/01 (2023.02); H10N 50/10 (2023.02); H10B 61/10 (2023.02)

(58) Field of Classification Search
CPC ........ H10N 50/80; H10N 50/01; H10N 50/10; H10N 59/00; H10B 61/00; H10B 61/10
See application file for complete search history.

(56) References Cited

U.S. PATENT DOCUMENTS

| 6,812,141 | B1 | 11/2004 | Gaidis et al. |
| 9,406,875 | B2 | 8/2016 | Li et al. |
| 9,704,919 | B1 | 7/2017 | Lu et al. |
| 10,312,434 | B2 | 6/2019 | Briggs et al. |

(Continued)

FOREIGN PATENT DOCUMENTS

| CN | 111613719 A | 9/2020 |
| KR | 1020150040238 A | 4/2015 |
| WO | 2019061852 A1 | 4/2019 |

OTHER PUBLICATIONS

Appeltans, Raf, "Embedded STT-MRAM cell design in and beyond 10 nm finFET nodes," Dissertation for Faculty of Engineering Science, Aug. 2017, 174 pages, Belgium.

(Continued)

*Primary Examiner* — Nicholas J Tobergte
*Assistant Examiner* — William Henry Anderson
(74) *Attorney, Agent, or Firm* — Tutunjian & Bitetto, P.C.; Daniel Morris

(57) ABSTRACT

A memory device that includes an magnetoresistive random-access memory (MRAM) stack positioned on an electrode, a metal line in contact with the electrode, and a sidewall spacer abutting the MRAM stack. The memory device also includes a stepped reach through conductor having a first height portion of the stepped reach through conductor in an undercut region positioned between the sidewall spacer and the metal line, and a second height portion having a greater height dimensions than the first height portion abutting an outer sidewall of the sidewall spacer.

14 Claims, 5 Drawing Sheets

(56) References Cited

U.S. PATENT DOCUMENTS

| | | | |
|---|---|---|---|
| 2015/0097159 A1 | 4/2015 | Apalkov et al. | |
| 2015/0255339 A1 | 9/2015 | Zhang et al. | |
| 2016/0268499 A1 | 9/2016 | You | |
| 2017/0338405 A1 | 11/2017 | Russell et al. | |
| 2018/0287051 A1 | 10/2018 | Bhosale et al. | |
| 2019/0006222 A1 | 1/2019 | Or-Bach et al. | |
| 2019/0355668 A1 | 11/2019 | Rizzolo et al. | |
| 2020/0028072 A1* | 1/2020 | Chuang | H10N 50/10 |
| 2020/0075669 A1* | 3/2020 | Chuang | H10N 50/10 |
| 2020/0098978 A1* | 3/2020 | Liao | H10N 50/80 |
| 2020/0388757 A1 | 12/2020 | Yang | |
| 2021/0091139 A1* | 3/2021 | Tseng | H10N 50/10 |
| 2021/0091301 A1 | 3/2021 | Arnold | |
| 2021/0111333 A1* | 4/2021 | Chang | H10N 50/01 |
| 2021/0375987 A1* | 12/2021 | Chuang | H10B 61/22 |
| 2022/0383922 A1* | 12/2022 | Frougier | G11C 11/161 |

OTHER PUBLICATIONS

International Search Report issued in corresponding PCT Application Serial No. PCT/EP2022/073582 dated Dec. 15, 2022.

\* cited by examiner

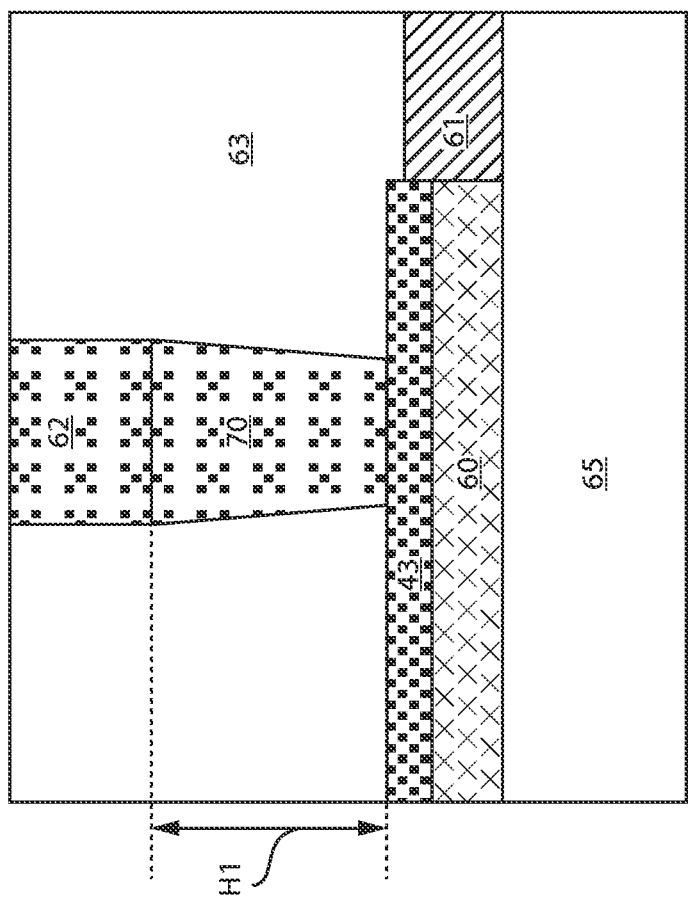
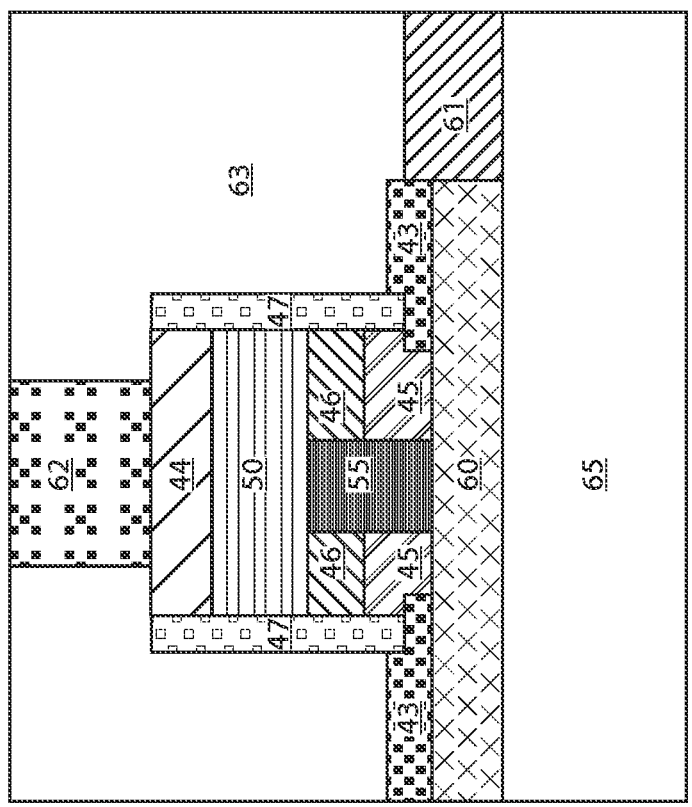
FIG. 1A
FIG. 1B

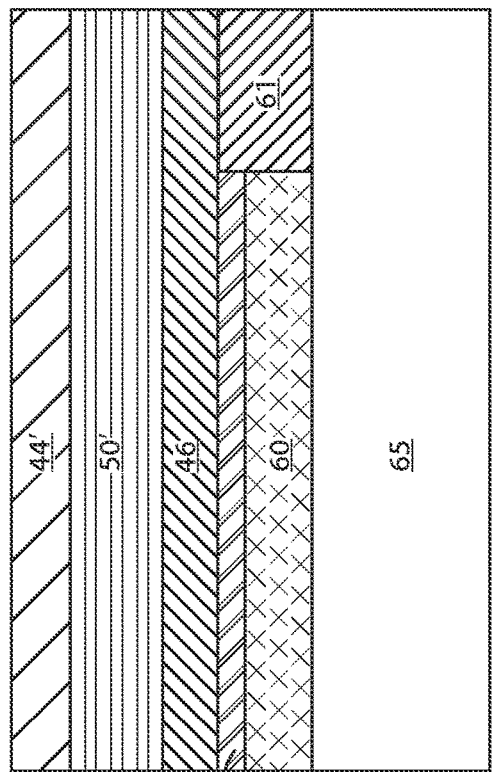
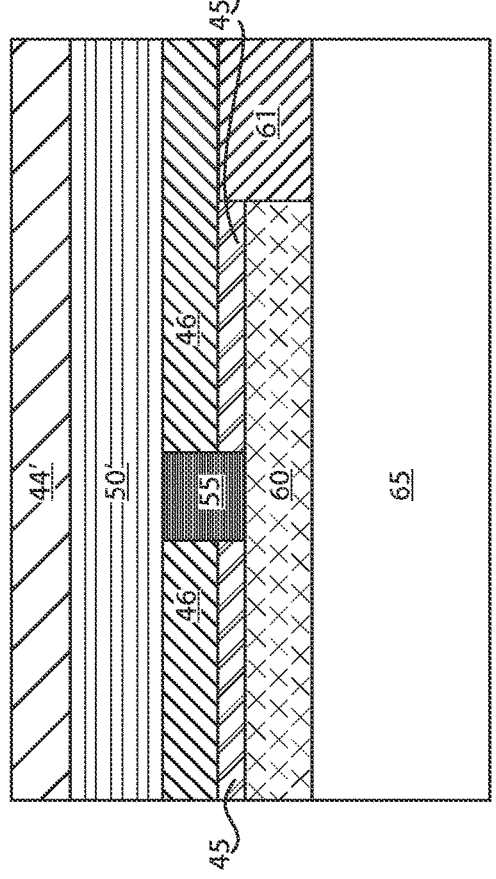
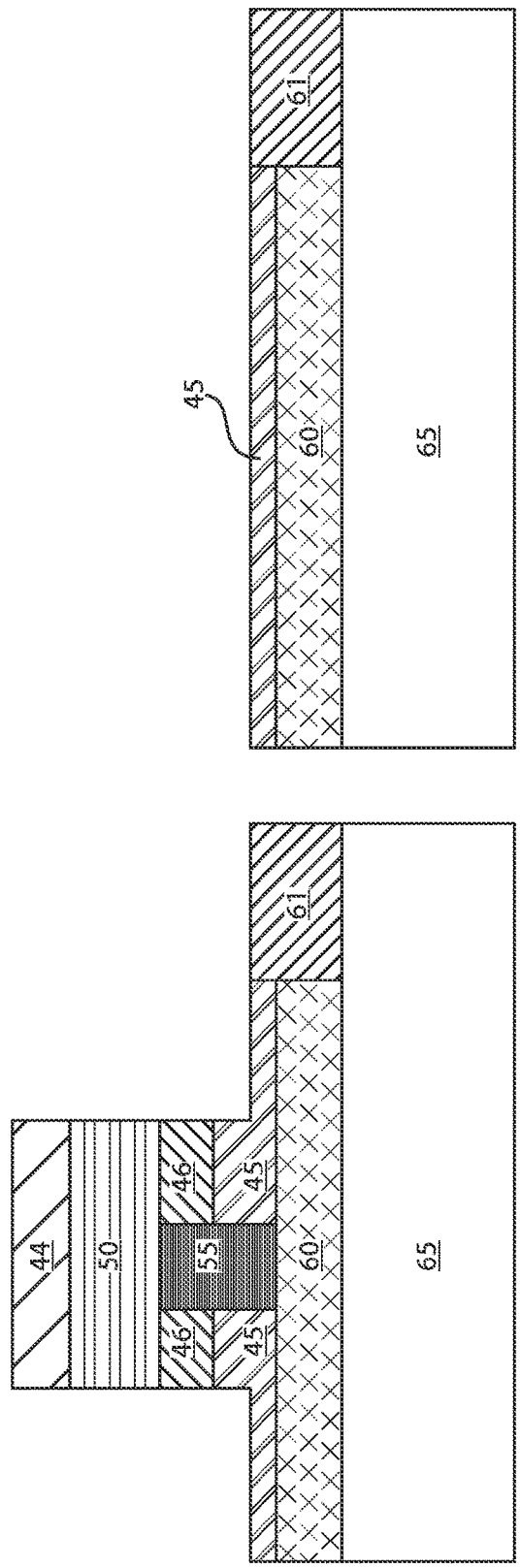

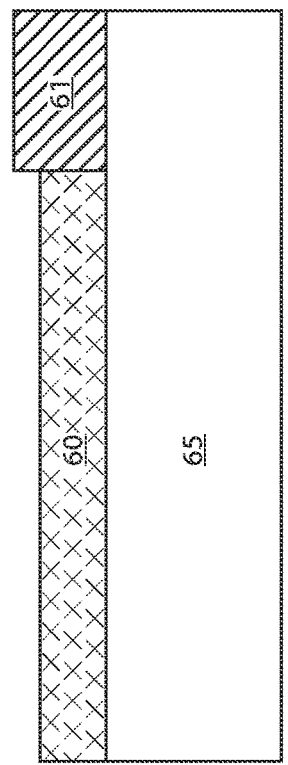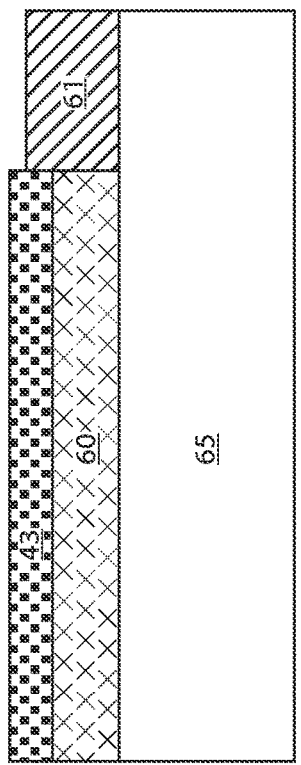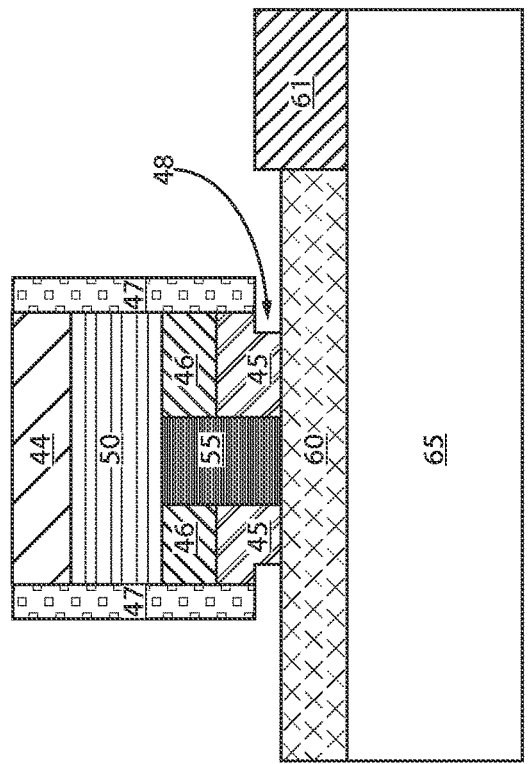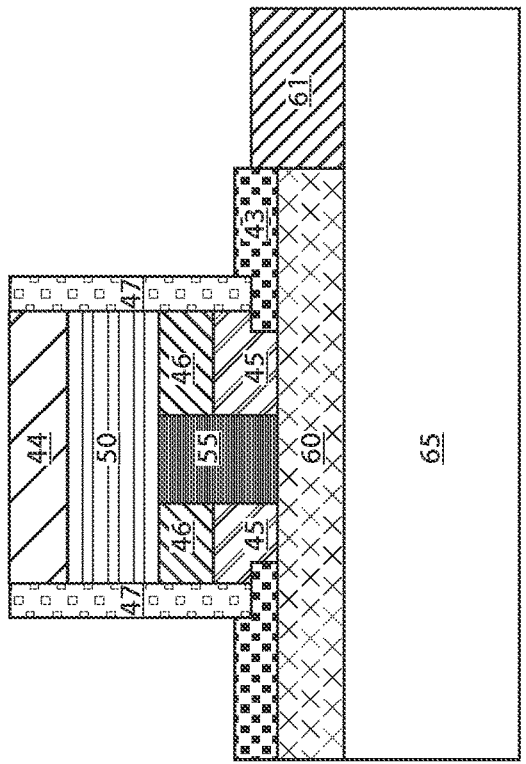

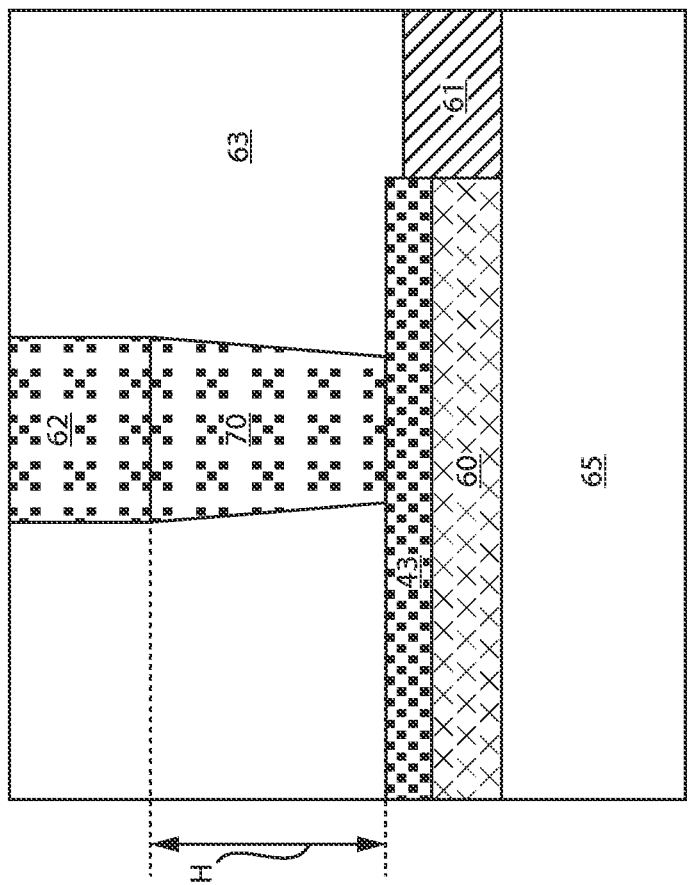
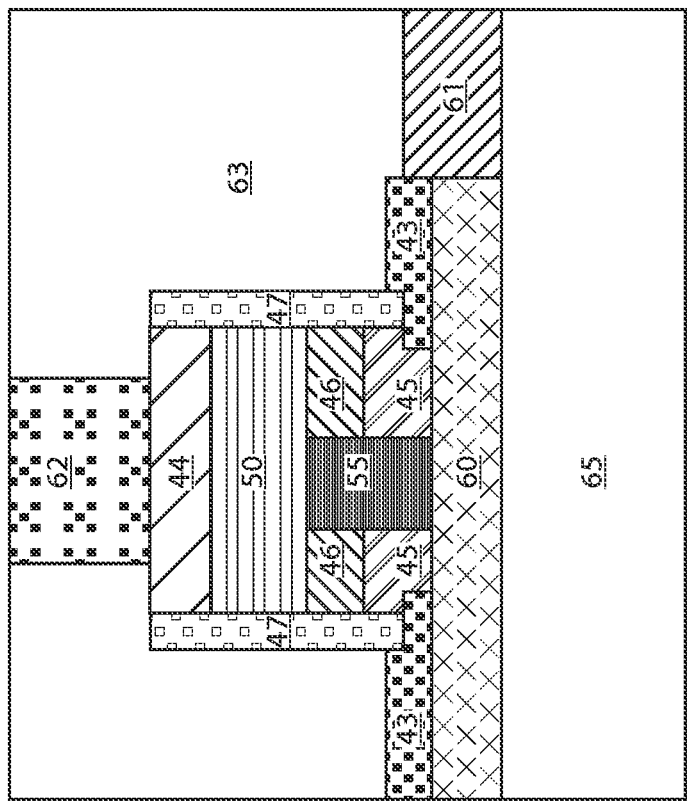
FIG. 8A
FIG. 8B

MRAM STACK WITH REDUCED HEIGHT

BACKGROUND

The present invention generally relates to memory devices, and more particularly to magnetic random access memory (MRAM) devices.

Semiconductor storage devices are used in integrated circuits (ICs) in electronic devices to provide data storage. One example of a semiconductor storage device is magnetic random access memory (MRAM). MRAM is non-volatile memory in which data is stored by programming a magnetic tunnel junction (MTJ) as part of an MRAM bit cell. One advantage of an MRAM is that MTJs can retain stored information even when power is turned off. This is because data is stored in the MTJ as a small magnetic element rather than as an electric charge or current. MRAM devices are typically integrated with logic devices, e.g., field effect transistors (FET) on a same substrate. Simultaneous processing can be required to integrated MRAM devices and logic devices together in electrical components.

SUMMARY

In accordance with one aspect of the present disclosure, a memory device is described that includes an magnetoresistive random-access memory (MRAM) stack positioned on an electrode, a metal line in contact with the electrode, and a sidewall spacer abutting the MRAM stack. The memory device also includes a stepped reach through conductor having a first height portion of the stepped reach through conductor in an undercut region positioned between the sidewall spacer and the metal line, and a second height portion having a greater height dimensions than the first height portion abutting an outer sidewall of the sidewall spacer.

In another embodiment, a memory including device is provided that includes a substrate having a BEOL interconnect portion and a memory portion. The memory device is present in the memory portion of the substrate. The memory device includes a memory stack position on electrode in communication with memory portion of a metal line. The memory device also includes a sidewall spacer abutting the memory stack. A stepped reach through conductor having a first height portion is present in an undercut region positioned between the sidewall spacer and the memory portion of the metal line, the stepped through conductive having a second height portion with a greater height dimensions than the first height portion abutting an outer sidewall of the sidewall spacer. The BEOL interconnect portion of the substrate incudes at least one via contact. The at least one via contacts is in contact with an extension of the stepped reach through conductor from the memory portion of the substrate. The at least one via is present on a BEOL interconnect portion of the metal line that is present in the BEOL interconnect portion of the substrate.

In another aspect of the present disclosure, a method of forming a memory device is provided. In one embodiment, the method may include forming a metal cap of a dielectric material atop a metal line, and forming an electrode in contact with the metal line through a via in the metal cap. The method may further include depositing a memory stack on the electrode, and forming a sidewall spacer abutting the memory stack. The memory stack may then be patterned. Patterning the memory stack may include using ion beam etch, wherein the metal cap of the dielectric material provides an etch stop preventing the metal line from back sputtering to the memory stack. In a following step, a stepped reach through conductor is formed in an undercut region positioned between the sidewall spacer and the metal line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1A is a side cross-sectional view of a memory device in a memory device portion of a substrate, in which a stepped reach through conductor is present in an undercut region positioned between a sidewall spacer that is abutting the memory stack of the memory device, and a memory portion of a metal line to an electrode to the memory stack, in accordance with one embodiment of the present disclosure.

FIG. 1B is a side cross-sectional view of the BEOL interconnect portion of the same substrate that includes the memory device depicted in FIG. 1A.

FIG. 4A is a side cross-sectional view of forming a memory stack on the electrode, and then a cap electrode layer on the memory device portion of the substrate, in accordance with one embodiment of the present disclosure.

FIG. 4B is a side cross-sectional view of the BEOL interconnect portion of the same substrate that includes the memory device depicted in FIG. 4A, in which a memory stack and cap electrode layer are formed.

FIG. 5A is a side cross-sectional view of patterning the cap electrode layer and the memory stack using ion beam etch, wherein the metal cap of the dielectric material provides an etch stop preventing the metal line from back sputtering to the memory stack, in accordance with one embodiment of the present disclosure.

FIG. 5B is a side cross-sectional view of the BEOL interconnect portion of the same substrate following the process steps for patterning the memory stack that is depicted in FIG. 5A.

FIG. 6A is a side cross-sectional view of forming a spacer on the sidewall of the memory stack and forming an undercut region extending beneath the sidewall spacer.

FIG. 6B is a side cross-sectional view of the BEOL interconnect portion of the same substrate following the process steps for sidewall spacer on the memory stack that is depicted in FIG. 6A.

FIG. 7A is a side cross-sectional view of forming a stepped reach through conductor the undercut region positioned between the sidewall spacer and the metal line, in accordance with one embodiment of the present disclosure.

FIG. 7B is a side cross-sectional view of the BEOL interconnect portion of the same substrate following the process steps for forming the stepped reach through conductor that is depicted in FIG. 7A.

FIG. 8A is a side cross-sectional view depicting forming a contacts to the memory device within the memory device portion of the substrate.

FIG. 8B is a side cross-sectional view depicting forming contacts within the logic device portion of the substrate.

DETAILED DESCRIPTION

Figure 2:
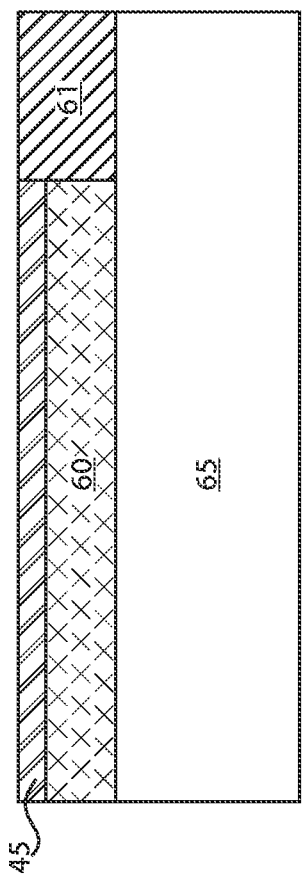
FIG. 2 is a side cross-sectional view of forming a metal cap atop a metal line in a memory device portion of a substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It has been determined that when integrating magnetoresistive random-access memory (MRAM) devices into the back end of the line (BEOL) process flow, if the stack height, i.e., height of the MRAM stack and electrodes to the MRAM stack, is too great, i.e., too tall, the back end of the line interconnect resistance becomes too great. The increased line interconnect resistance decreases device performance. The MRAM stack height can be dictated by the thickness of dielectric material layers that are formed over the metal lines underlying the MRAM stack. The thickness of the dielectric layer of prior devices is generally thick to protect the metal lines that are underlying the MRAM stack from subtractive forming methods. More particularly, when patterning the material layers for the MRAM stack, ion beam etching is used. If the etchant from the IBE process reaches the underlying metal lines, the metal from the metal lines can back sputter to the MRAM stack sidewalls. The metal back sputtering from the metal lines to the MRAM stack can degrade the performance or cause failure of the magnetic tunnel junction of the MRAM stack due to shorting. To avoid back sputtering, masking dielectrics are integrated into the stack structures overlying the metal lines. However, this increases the amount of material that is overlying the metal lines, which also increases the via opening height for via contacts to be formed through the material stacks that are employed as etch stops to avoid the aforementioned back sputtering. The increased via opening height results in increase of via resistance of the BEOL interconnect, and this could be significant for vias at lower metal line levels.

In view of the above discovered disadvantages, the structures and methods of the present disclosure start with a recessed metal line height, and then form a metal cap layer (composed of a dielectric material) over the metal line. The reduced start height of the metal line, and the metal cap layer both protect the memory stack from back sputtering, and maintains a minimized stack height that does not result in increased via resistance. The structure further includes a metal extension layer over the recessed metal line. The metal extension layer is present in the memory portion of the device as a stepped reach through conductor and extending from the memory portion to BEOL interconnect portions of the device. Vias can be present directly landing on the metal extension layer in both the memory and BEOL interconnect portions of the device. The structures and methods of the present disclosure are now described with greater detail with reference to FIGS. 1A-8B.

FIG. 1A depicts a memory device 100 in a memory region of the device. FIG. 1B depicts a BEOL interconnect region, which could be over the core logic devices. The memory region and the BEOL interconnect region are both over portions of the devices formed on the same wafer.

Referring to FIG. 1A, the memory device 100 includes a memory stack 50 on a bottom electrode 55. The bottom electrode 55 is present atop a metal line 60. The metal line 60 is present between the bottom electrode 55 to the memory stack 50 and an underlying device 65.

The memory device 100 includes a memory stack 50, which in some embodiments can be referred to as an MRAM stack 50. In some embodiments, the memory stack 50 may be configured for a magnetic tunnel junction (MTJ) type device. The MRAM stack 50 may be composed of material layers in accordance with the following description.

A MJT structure includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer" or "free magnetization layer") has a non-fixed magnetization, and the other ferromagnetic layer (referred to as a "magnetic pinned layer", or "reference layer", or "fixed magnetization layer") has a "fixed" magnetization. An MTJ stores information by switching the magnetization state of the magnetic free layer.

In some embodiments, the magnetic orientation of the magnetic layers, i.e., the free magnetization layer and the fixed magnetization layer, of the magnetic tunnel junction (MTJ) structure for the memory device 100 is in a perpendicular direction. The perpendicular direction, for example, refers to the direction which is perpendicular to the plane of the layers of the MTI structure. In one embodiment, a magnetically fixed layer, i.e., fixed magnetization layer, is disposed below the magnetic free layer, i.e., free magnetization layer, forming a bottom pinned perpendicular MTJ (pMTJ) element. The perpendicular direction of the fixed layer is in a first perpendicular direction. The first perpendicular direction is shown to be in an upward direction away from the underlying supporting substrate. As for the magnetic orientation of the free layer, it may be programmed to be in a first or same (parallel) direction as the fixed layer or in a second or opposite (anti-parallel) direction as the fixed layer.

Each of the fixed magnetization layer and the free magnetization layer may be composed of a ferromagnetic material. For example, each of the fixed magnetization layer and the free magnetization layer may be composed of a composition including cobalt (Co), iron (Fe), nickel (Ni), boron (B), or any combination thereof. In one example, the fixed magnetization layer can be formed of CoFeB or CoFe. In one example, the free magnetization layer can be formed of CoFeB or CoFe. Each of the fixed magnetization layer and the free magnetization layer may have a thickness ranging from 10 nm to 100 nm. In some embodiments, each of the fixed magnetization layer and the free magnetization layer may have a thickness ranging from 20 nm to 50 nm.

In some embodiments, the fixed magnetization layer may include a synthetic antiferromagnet (SAF) consisting of two ferromagnetic layers antiferromagnetically coupled through a nonmagnetic spacer layer (such as Ru). In some embodiments, the dipolar interaction between the two magnetic electrodes results in a highly asymmetrical reversal of the free layer, i.e., free magnetization layer, with respect to the applied field or to the current density. Moreover, if the induced shift of the loop (Hcoupl) is greater than the free layer coercive field (HC), only one resistance state remains stable at zero field, which is not suitable for applications. For in plane MTJ, this problem can be been solved by replacing the pinned layer with a synthetic antiferromagnet (SAF) consisting of two ferromagnetic layers antiferromagnetically coupled through a nonmagnetic spacer layer (such as Ru). In one embodiment, the synthetic antiferromagnet (SAF) employed for the fixed magnetization layer may include a stack of $Ta_3/Pt_{30}/(Co_{0.5}/Pt_{0.4})_5/Co_{0.5}/Ru_{0.85}/(Co_{0.5}/Pt_{0.4})_3/Co_{0.5}/CoFeB_1$.

A tunnel junction dielectric layer is present between the fixed magnetization layer and the free magnetization layer and is the site of tunnel magnetoresistance (TMR), which is the magnetoresistive effect that occurs in the magnetic tunnel junction (MTJ) structure. The tunnel junction dielectric layer can be formed of a non-magnetic, insulating material such as magnesium oxide (MgO), aluminum oxide ($Al_2O_3$), or titanium oxide ($TiO_2$) or any other suitable materials. The tunnel junction dielectric layer may have a thickness ranging from 1 nm to 10 nm. In some embodiments, the tunnel junction dielectric layer may have a thickness ranging from 2 nm to 5 nm.

The underlying device layer 65 may include active and/or passive electronic devices, with middle of the line (MOL) contacts or even lower back end of the line (BEOL) interconnects. For example, the underlying devices 65 may be transistors, such as field effect transistors (FETs), or fin field effect transistors (FinFETs). The underlying devices may also be passive devices, such as capacitors and resistors. The underlying devices 65 may be a combination of active and passive devices. Although not depicted in FIG. 1A, the underlying devices 65 may be formed on a semiconductor substrate, such as a type IV semiconductor substrate, e.g., silicon substrate, or type III-V semiconductor substrate. A lower device interlevel dielectric may be present over the active and/or passive devices, and connecting circuitry may be present through the interlevel dielectric providing electrical communication to the active and passive devices that are integrated in the underlying devices layer 65. The underlying devices layer 65 may be formed using front end of the line (FEOL) processing.

The metal line 60 is present over the underlying device layer 65. The metal line 60 may also be designated Mx−1. To maintain a reduced stack height, the metal line 60 is recessed and a dielectric cap (metal capping layer) is formed to provide additional buffer layer for MRAM IBE without increasing the ILD1 thickness. The metal line 60 may be composed of any metal or metal containing material, e.g., copper (Cu), aluminum (Al), tungsten (W), tungsten nitride (WN), titanium (Ti), titanium nitride (TiN), tantalum (Ta), tantalum nitride (TaN) and combinations thereof. As will be discussed in greater detail below, the metal line 60 is not only present in the memory device region that is depicted in FIG. 1A, but it also presents in the BEOL interconnect region that is depicted in FIG. 1B.

As noted above, the metal capping layer 45 is deposited atop the metal line 30 to protect the metal line 30 during processing that is used to pattern the memory stack 50. As will be described in greater detail below, the material layers that provide the memory stack 50 are patterned using an ion beam etch (IBE), which is a subtractive (material removal) method. As noted above, if during the substrative process, e.g., ion beam etch (IBE), etches into the metal layer 60 during the process sequence for patterning the memory stack 50, the metal material of the metal layer 60 can back sputter onto the sidewalls of the memory stack 50. This disrupts the magnetic character of the memory stack 50. The metal capping layer 45 of the present disclosure advantageously can eliminate that possibility.

In some embodiments, the metal lines are formed in trenches in the interlevel dielectric layer (ILD) 61. The ILD 61 can be composed of any dielectric material composition. For example, when referring to an interlevel dielectric layer, it is noted that the composition of that layer may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The above description for interlevel dielectric layer is suitable for any ILD layer in the structures described herein.

The memory device 100 includes and upper and lower electrodes 44, 55. The upper electrode 44 may also be referred to as a cap electrode, and is in direct contact with the upper surface of the memory stack 50. The sidewalls of the upper electrode 44 may be aligned with the sidewalls of the patterned memory stack 50. This is because the same pattern that is used for etching the memory stack 50 is also used for etching the upper electrode 44. The upper electrode 44 may have a width that is the same as the width as the patterned memory stack 50. The upper electrode 44 may be composed of any metal or metal nitride. In some embodiments, the upper electrode 44 may be composed of tantalum nitride (TaN). In other embodiments, the upper electrode 44 can be composed of other metallic materials, such as Al, Cu, Ti, TiN, Ta, TaN, Ru, W, Cr and combinations thereof.

The lower electrode 55 may be positioned in a via opening extending into direct contact with an upper surface of the metal line 60. The opposing end of the lower electrode 55 is in direct contact with the lower surface of the memory stack 50. The lower electrode 55 may be composed of any metal or metal nitride. In some embodiments, the lower electrode 55 may be composed of tantalum nitride (TaN) or TiN. In other embodiments, the lower electrode 55 can be composed of other metallic materials, such as Al, Cu, Ti, TiN, Ta, Ru, W, Cr and combinations thereof. The lower electrode 55 may have a width that is less than the width of the memory stack 50. In some embodiments, the lower electrode 55 is in contact with a centrally positioned portion of the memory stack's width.

The via opening that the lower electrode 55 is present in may extend through a memory interlevel dielectric layer (ILD) 46, and a remaining portion of the metal capping layer 45. The outside sidewalls of the memory ILD 46 and the metal capping layer 45 may be aligned with the outside sidewall of the memory stack 50, as these structures may be patterned with the same mask and etch steps.

A sidewall spacer 47 may be present abutting the memory stack 50. The sidewall spacer 46 may be composed of any dielectric material, such as an oxide or nitride. For example, the sidewall spacer 46 may be composed of silicon nitride. In another example, the sidewall spacer 46 may be composed of silicon oxide. The sidewall spacer 47 may also about the sidewall of the cap electrode 44. The upper surface of the sidewall spacer 47 and the upper surface of the cap electrode 44 may be coplanar. The lower surface of the sidewall spacer 47 may be in direct contact with the upper surface of the first height portion of the stepped reach through conductor 43 that is present in the undercut region. The stepped reach through conductor 43 is described in more detail in subsequent paragraphs. The second height portion of the stepped reach through conductive abuts the outside sidewall of the sidewall spacer 47.

Still referring to FIG. 1A, an undercut region may be present underlying the base surface of the sidewall spacer 47. The undercut region may also extend into the remaining portion of the metal capping layer 45. The undercut region may also be referred to as a notch. As will be described in greater detail below, the undercut region may be formed using an isotropic etch.

In some embodiments, a stepped reach through conductor 43 is present in the undercut region. The stepped reach through conductor 43 is in direct contact with the upper surface of the portions of the metal line 60 that are not underlying the memory stack 50, as well as the portions of the metal line 60 underlying the undercut region, i.e., the undercut region that extends below the base of the sidewall spacer 47, and extends beyond the inner sidewall of the sidewall spacer 47. When the isotropic etch forms the undercut region is removes the exposed portion of the metal capping layer 45. This exposes a portion of the metal line 60. As noted previously, the metal line 60 was recessed to reduce the stack height for the memory device 100. Forming the stepped reach through conductive 43 increases the thickness of conductive material in the metal line 60 that was previously recessed. This provides reduced line resistance in the metal line 60.

Referring to FIG. 1A, by "stepped" it is meant that in the memory region, the reach through conductor has at least two thickness portions. As depicted in FIG. 1A, the stepped reach through conductor 43 has a first height portion in the undercut region positioned between the sidewall spacer 47 and the metal line 60, and a second height portion having a greater height dimensions than the first height portion abutting an outer sidewall of the sidewall spacer 47. The memory interlevel dielectric layer 46 and the remaining portion of the metal capping layer 45 provide a multi-layer inner spacer portion present between the electrode 55 contacting the metal line 60 and the sidewall spacer 47. The remaining portion of the metal capping layer 45 has a composition selected from the group consisting of semiconductor oxide containing dielectric, a semiconductor nitride containing dielectric, a metal oxide and combinations thereof.

Still referring to FIG. 1A, a metal line 62 may be to the capping electrode 44. The metal line 62 may be composed of a metal or metal containing material, e.g., copper (Cu), aluminum (Al), tungsten (W), tungsten nitride (WN), titanium (Ti), titanium nitride (TiN), tantalum (Ta), tantalum nitride (TaN) and combinations thereof. An intralevel dielectric layer 63 may encapsulate a majority of the memory device 100.

The memory stack 50, e.g., MRAM stack, is present in a memory region of the device, as depicted in FIG. 1A; however the metal line 60 and the stepped reach through conductor 43 extend from the memory region of the device of to a BEOL interconnect region of the device, as depicted in FIG. 1B.

Referring to FIGS. 1A and 1B, the memory device 100 present in the memory portion of the device (can be referred to memory portion of substrate), in which the memory device 100 includes a memory stack 50 position on electrode 55 in communication with memory portion of a metal line 60. As described above, the memory device 100 includes a sidewall spacer 47 abutting the memory stack 50, wherein a stepped reach through conductor 43 having a first height portion is present in an undercut region positioned between the sidewall spacer 47 and the memory portion of the metal line 60. The stepped through conductor 43 has a second height portion with a greater height dimensions than the first height portion abutting an outer sidewall of the sidewall spacer 47. The metal line 60 and the portion of the stepped through conductor having the second height extends from the region of the device including the memory device to a BEOL interconnect region of the device, as depicted in FIG. 1B.

Referring to FIG. 1B, at least one via contact 70 (also referred to as via contact Vx) in the logic portion of the device (can be referred to logic portion of substrate), is in direct contact with an upper surface of the extension of the stepped reach through conductor 43 that is present on a BEOL interconnect portion of the metal line 60 that is present in the BEOL interconnect portion of the substrate. The BEOL interconnect portion of the device includes access transistors in electrical communication with the at least one via contact 70. The at least one via contact 70 may be composed of any metal or metal nitride. Some compositions of metal containing materials suitable for the at least one via contact 70 include Al, Cu, Ti, TiN, Ta, TaN, Ru, W, Cr and combinations thereof.

As illustrated in FIGS. 1A and 1B, the lower electrode 55 of the memory device lands on a recessed upper surface of the metal line 60, whereas the at least one via contact 70 in the BEOL interconnect portion of the device lands on a portion of the metal line 60 having an increased thickness by the addition of the extension of the stepped reach through conductor 43 having the second height. The at least one via contact 70 is in direct contact with the upper surface of the extension of the stepped reach through conductor 43 that is present in the BEOL interconnect portion. Similar to the memory device region depicted in FIG. 1A, the BEOL interconnect region depicted in FIG. 1B includes the metal line 60 overlying an underlying device layer 65. The description for the underlying device layer 65 depicted in FIG. 1A is suitable for the description of the underlying device layer 65 depicted in FIG. 1B.

Referring to FIGS. 1A and 1B, the height H1 of the at least one via contact 70 may range from 30 nm to 100 nm. The height H1 of the at least one via contact 70 is similar to the stack height extending from the base of the lower electrode 55 to the upper surface of the cap electrode 44 for the memory device 100. In some embodiments, the stack height for the memory device may range from 40 nm to 110 nm.

Some embodiments of process flow for forming the structure depicted in FIGS. 1A and 1B is now described in greater detail with reference to FIGS. 2-8B.

FIG. 2 illustrates one embodiment of an initial structure employed to produce the structures depicted in FIGS. 1A and 1B. The structure depicted in FIG. 2 is suitable for describing the initial structure for both the memory region and the BEOL interconnect region. A stack of an interlevel dielectric layer 61 overlying the underlayer device layer is patterned to provide a trench that is to be filled with a metal material for forming the metal line 60. The trench may be patterned using photolithography and etch processes. The metal line 60 may then be formed using a deposition process, such as plating, electroplating or sputtering. Following deposition, a planarization process may be employed to provide that the upper surface of the metal line is coplanar with the upper surface of the remaining portion of the interlevel dielectric layer 61.

Still referring to FIG. 2, in some embodiments, the metal line 60 is recessed using a selective metal etch process, such as reactive ion etching (RIE) or wet metal recess. The metal line 60 may be recessed to a thickness ranging from 15 nm to 35 nm. In one example, the metal line 60 is recessed to a thickness of ~20 nm.

Following recessing of the metal line 60, a metal capping layer 45 is deposited atop the recessed metal line surface. As noted above, the metal capping layer 45 is formed to ensure that the metal line 60 is protected from being etched during the subsequent etch processes that are used to pattern the memory stack 50. The metal capping layer 45 may be referred to as an etch stop. In some embodiments, the metal capping layer 45 may be composed of a dielectric material, such as an oxide, e.g., silicon oxide, or nitride, e.g., silicon nitride, SiBCN, SiOCN. In some embodiments, the metal capping layer 45 may be composed of a low-k dielectric. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof.

The metal capping layer 45 may be deposited. "Deposition" is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Following deposition, a planarization process, such as chemical mechanical planarization (CMP), may be applied to provide that the upper surface of the metal capping layer 45 is coplanar with the remaining portion of the interlevel dielectric layer 61. The thickness of the metal capping layer 45 may range from ranging from 15 nm to 35 nm. In one example, the metal capping layer 45 has a thickness of 20 nm.

Figure 3B:
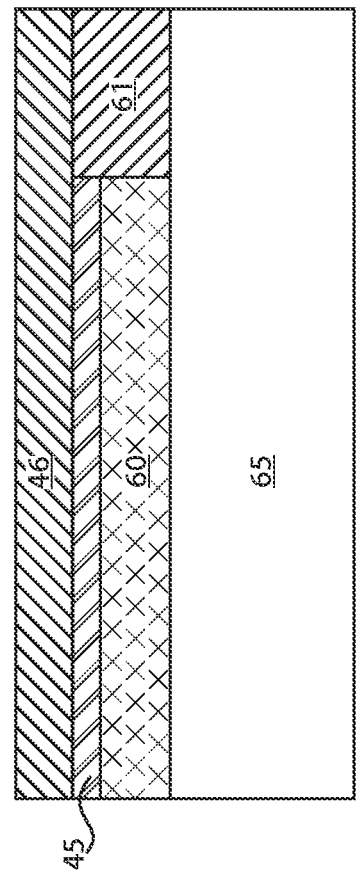
FIG. 3B is a side cross-sectional view of the BEOL interconnect portion of the same substrate that includes the memory device depicted in FIG. 3A.
Figure 3A:
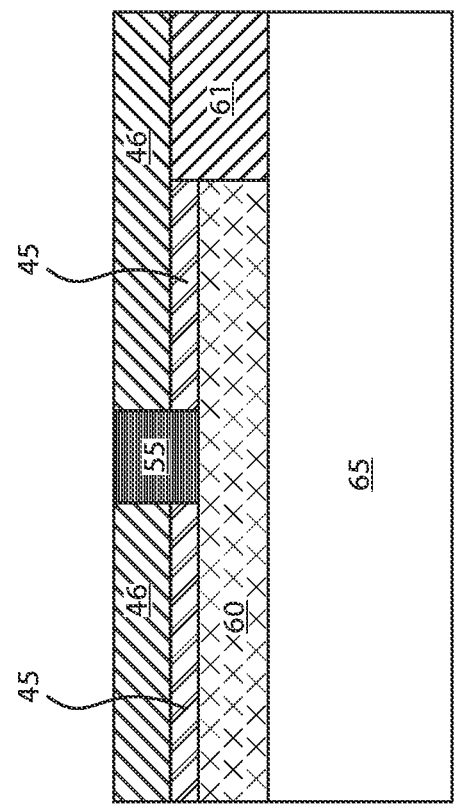
FIG. 3A is a side cross-sectional view of forming an electrode to the metal in the memory device portion of the substrate.

FIGS. 3A and 3B depict one embodiment of forming the lower electrode 55 to the metal line 60 in the memory device region. First, an interlevel dielectric layer 46 is blanket deposited atop the memory device region and the BEOL interconnect region. Second, the lower electrode 55 is formed by etching a via opening exposing an upper surface of the recessed upper surface of the metal line 60 in the memory device region. The via opening is formed using photolithography and etch processes, e.g., reactive ion etch (RIE). Following formation of the via opening, the lower electrode 55 is formed by depositing a metal fill material within the via opening, which can be followed with a planarization step.

FIGS. 4A and 4B are side cross-sectional views depicting depositing the blanket material layers 50' for the memory stack 50 on the lower electrode 55, and then a cap electrode layer 44'. The compositions for the blanket material layers 50' are provided in the description of the memory stack 50 that is described in FIG. 1A. The composition of the cap electrode layer 44' is provided by the description of the cap electrode layer that is described in FIG. 1A.

FIGS. 5A and 5B depict patterning the cap electrode layer 44 and the blanket material layers for the memory stack 50 using ion beam etch (IBE), wherein the metal capping layer 45 of the dielectric material provides an etch stop in both the memory device region and the BEOL interconnect region. In the memory device region, the metal capping layer 45 stops the substrative etch from reaching the metal line 60, hence preventing the metal line from back sputtering to the memory stack 50.

Ion Beam Etching (or Milling) is a dry plasma etch method which utilizes a remote broad beam ion/plasma source to remove substrate material by physical inert gas and/or chemical reactive gas means. Like other dry plasma etch techniques, some merits of IBE include controllable etch rates, high anisotropy, high selectivity, high uniformity, high aspect ratio, and low substrate damage.

Fundamentally, ion beam etching is a low pressure, anisotropic and neutralized dry plasma technique which is capable to define surface features to ten's of microns to the nanometer scale. The bulk plasma is generated in the ion source which is remote from the etch surface. From this remote source, a directed beam is accelerated towards the etch surface. At the ion source, the directed beam acquires specific properties such as ion energy, ion beam current, and ion trajectory. Since the etch surface is not immersed in the bulk plasma, the risk of radiation damage is minimized and the directed beam frees the etch surface from RF bias control.

One feature of ion beam etch is its ability to remove any material by a purely physical process. Ion beam etching (IBE) is considered a universal etchant process method. For example, IBE can etch noble and refractory metals, alloys, and magnetic materials without any harsh chemical reactants.

A common configuration of the ion beam etching tool produces an Argon ion beam. Ion beam etching is a highly repeatable solution for etching stacks of multiple materials or layers. With a configuration that integrates SIMS (secondary ion mass spectroscopy) as an in-situ control, ion beam etch allows you to remove layers of one material and stop immediately at the next layer.

In an ion beam etch system, a broad beam collimated and highly directional ion source is used to physically mill material from a substrate mounted on a rotating fixture with adjustable tilt angle. Typically, gridded ion sources are used and are neutralized with an independent electron source.

There are also two other types of ion beam etching: reactive ion beam etching (RIBE) and chemically assisted ion beam etching (CAIBE). RIBE is identical to IBE, except that some or all of the ion beam is composed of reactive ions; in standard IBE, the ion beam is composed of only inert gases. In CAIBE, un-ionized reactive species are introduced into the process independent of the ion beam, close to the substrate. For certain materials, RIBE and CAIBE offer additional control of etch anisotropy, sputter redeposition and etch rate over IBE.

Referring to FIGS. 5A and 5B, following masking on the region that provides the memory stack 50, etching may proceed to remove the exposed portions of the blanket layers, the exposed portions of the memory interlevel dielectric layer 61, and to recess the metal capping layer 45. As noted, the metal capping layer 45 may function as an etch stop. The etch process at this stage of the process flow may also recess the remaining portion of the interlevel dielectric layer 61 that was patterned to provide the trench to house the metal line 60.

FIGS. 6A and 6B depict one embodiment of forming a spacer (sidewall spacer 47) on the sidewall of the memory stack 50 and forming an undercut region extending beneath the sidewall spacer 47. The sidewall spacer 47 may be formed by blanket depositing a conformal spacer material layer on the structure depicted in FIGS. 5A and 5B. Following deposition of the conformal layer, an etch back process, such as an anisotropic etch, e.g., reactive ion etch (RIE), may remove the horizontally orientated portions of the conformal layer, wherein the vertically orientated portions of the conformal layer in their majority remain to provide the sidewall spacer 47. In one example, the conformal layer may be blanket deposited using chemical vapor deposition (CVD) or atomic layer deposition (ALD).

Following formation of the sidewall spacer 47, the undercut region 48 may be formed. The undercut region 48 may be formed using an isotropic etch, such as a plasma etch, or wet chemical etch. Contrary to an anisotropic etch, an isotropic etch is not directional. The isotropic etch may be selective. More specifically, the isotropic etch for forming the undercut region 48 removes the material of the metal capping layer 45 selectively to the metal line 60 and the sidewall spacer 47. The isotropic etch may also be selective to the remaining portion of the interlevel dielectric layer 61.

The isotropic etch step may be continued until the notch (undercut region 48) is formed by removing a portion of the metal capping layer 45 undercutting the overlying portion of the sidewall spacer 47 and providing an exposure portion of the upper surface of the meal line 60 extending from beneath the spacer 47 to the remaining portion of the interlevel dielectric layer 61. The isotropic etch may also remove the exposed portion of the metal capping layer 45 from the BEOL interconnect region depicted in FIG. 6B. In some embodiments, the isotropic etch removes the entirety of the metal capping layer 45 from the BEOL interconnect region depicted in FIG. 6B.

FIGS. 7A and 7B depict depositing the stepped reach through conductor 43 in the undercut region positioned between the sidewall spacer and the metal line 60. The stepped reach through conductor 43 extends onto the recessed upper surface of the metal line 60 that is present in the BEOL interconnect region of the device. In some embodiments, the stepped reach through conductor 43 is composed of a metal that is selectively deposited on exposed metal surfaces, i.e., the exposed portions of the metal line 60 in the memory device region and the BEOL interconnect region. In some embodiments, selective deposition includes the deposition of a metal on a metal surface without deposition on dielectric surfaces. The selective deposition process may include chemical vapor deposition, atomic layer deposition, selective tungsten chemical vapor deposition (W-CVD), area specific deposition (ASD), area-selective atomic layer deposition (AS-ALD) and combinations thereof. As illustrated in FIG. 7A, the deposited stepped reach through conductor 43 fills the undercut region and is present in direct contact with the memory portion of the metal line 60. As illustrated in FIG. 7B, the deposited stepped reach through conductor 43 is formed atop the metal line 60 that is present in the BEOL interconnect region.

FIG. 8A depicts forming a top metal line 62 to the memory device within the memory device portion of the substrate. FIG. 8B depicts forming top metal line and via between the top metal line 62 and bottom metal line within the BEOL interconnect portion of the substrate. First, an interlevel dielectric layer 63 is blanket deposited over the memory device region and the BEOL interconnect region. In a following step, an metal line trench 62 is formed, followed by via 70 patterning and etch, landing over bottom metal line (43 over 60)] in the BEOL interconnect region. Thereafter, metal for the via contact 70 and metal line 62 can be formed by a Cu dual damascene process.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is nit intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of an MRAM stack with reduced height, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory device comprising:
    a magnetic random access memory (MRAM) stack positioned on a bottom electrode;
    a metal line directly in contact with the bottom electrode;
    a sidewall spacer abutting the MRAM stack; and
    a stepped reach through conductor having a first height portion of the stepped reach through conductor in an undercut region positioned between the sidewall spacer and the metal line, and a second height portion having a greater height dimension than the first height portion abutting an outer sidewall of the sidewall spacer on a lateral side of the sidewall spacer facing away from the MRAM stack, wherein the stepped reach through conductor connects to the metal line continuously between opposite sides of the MRAM stack and the bottom electrode.

2. The memory device of claim 1 further comprising a cap electrode contacting an opposite surface of the MRAM stack than the bottom electrode that is in contact with the metal line.

3. The memory device of claim 1 further comprising a multi-layer inner spacer portion present between the bottom electrode contacting the metal line and the sidewall spacer.

4. The memory device of claim 3, wherein the multi-layer inner spacer portion comprises a metal cap layer present on the metal line, and a inter level dielectric layer present between the MRAM stack and the metal cap layer.

5. The memory device of claim 4, wherein the metal cap layer has a composition selected from the group consisting of semiconductor oxide containing dielectric, a semiconductor nitride containing dielectric, a metal oxide and combinations thereof.

6. The memory device of claim 4, wherein the metal cap layer is in contact with the first height portion of the stepped reach through conductor.

7. The memory device of claim 1, wherein the MRAM stack is present in an MRAM portion of a substrate, and the metal line and the stepped reach through conductor extend from the MRAM portion of the substrate to a logic portion of the substrate.

8. A device comprising:
    a substrate including a logic portion and a memory portion;
    a memory device present in the memory portion of the substrate, the memory device including a memory stack positioned on a bottom electrode directly in contact with a memory portion of a metal line, the memory device including a sidewall spacer abutting the memory stack, wherein a stepped reach through conductor having a first height portion of the stepped reach through conductor in an undercut region positioned between the sidewall spacer and the metal line, and a second height portion with a greater height dimension than the first height portion abutting an outer sidewall of the sidewall spacer on a lateral side of the sidewall spacer, wherein the stepped reach through conductor connects to the metal line continuously between opposite sides of the memory stack and;

at least one via contact in the logic portion of the substrate, the at least one via contact is connected to an extension from the stepped reach through conductor that is present on a logic portion of the metal line that is present in the logic portion of the substrate.

9. The device of claim 8, wherein the logic portion of the substrate includes access transistors in electrical communication with the at least one via contact.

10. The device of claim 8 further comprising a cap electrode contacting an opposite surface of the memory stack than the bottom electrode that is in contact with the metal line.

11. The device of claim 8 further comprising a multi-layer inner spacer portion present between the bottom electrode contacting the memory portion of the metal line and the sidewall spacer.

12. The device of claim 11, wherein the multi-layer inner spacer portion comprises a metal cap layer present on the memory portion of the metal line, and a inter level dielectric layer present between the memory stack and the metal cap layer.

13. The device of claim 12, wherein the metal cap layer has a composition selected from the group consisting of semiconductor oxide containing dielectric, a semiconductor nitride containing dielectric, a metal oxide, and combinations thereof.

14. The device of claim 13, wherein the metal cap layer is in contact with the first height portion of the stepped reach through conductor.

* * * * *